United States Patent
Haziza

(10) Patent No.: US 10,177,453 B2
(45) Date of Patent: Jan. 8, 2019

(54) SOFTWARE CONTROLLED ANTENNA

(71) Applicant: Wafer LLC, Hanover, NH (US)

(72) Inventor: Dedi David Haziza, Kiryat Motzkin (IL)

(73) Assignee: WAFER LLC, Hanover, NH (US)

(*) Notice: Subject to any disclaimer, the term of this patent is extended or adjusted under 35 U.S.C. 154(b) by 0 days.

(21) Appl. No.: 15/667,584

(22) Filed: Aug. 2, 2017

(65) Prior Publication Data
US 2018/0062268 A1 Mar. 1, 2018

Related U.S. Application Data

(60) Provisional application No. 62/431,393, filed on Dec. 7, 2016, provisional application No. 62/382,506, filed
(Continued)

(51) Int. Cl.
| H01Q 21/00 | (2006.01) |
| H01Q 9/04 | (2006.01) |
| H01L 23/66 | (2006.01) |
| H01Q 1/48 | (2006.01) |
| H01Q 1/50 | (2006.01) |
| H01Q 3/36 | (2006.01) |
| H01Q 21/24 | (2006.01) |
| H04B 7/0413 | (2017.01) |

(Continued)

(52) U.S. Cl.
CPC ........... *H01Q 9/0457* (2013.01); *H01L 23/66* (2013.01); *H01Q 1/48* (2013.01); *H01Q 1/50* (2013.01); *H01Q 3/24* (2013.01); *H01Q 3/36* (2013.01); *H01Q 9/0414* (2013.01); *H01Q 9/0442* (2013.01); *H01Q 9/145* (2013.01); *H01Q 21/065* (2013.01); *H01Q 21/24* (2013.01); *H01Q 21/245* (2013.01); *H01Q 21/28* (2013.01); *H04B 7/0413* (2013.01); *H04B 7/08* (2013.01); *H04L 27/18* (2013.01)

(58) Field of Classification Search
CPC .... H01Q 9/0457; H01Q 9/145; H01Q 9/0442; H01Q 3/24; H01Q 3/36; H01Q 1/48
USPC ........................................................ 343/701
See application file for complete search history.

(56) References Cited

U.S. PATENT DOCUMENTS

| 6,727,855 B1* | 4/2004 | Nalbandian | H01Q 9/0421 343/700 MS |
| 7,541,886 B2* | 6/2009 | Yoneyama | H01P 5/1022 333/248 |

(Continued)

*Primary Examiner* — Lam T Mai
(74) *Attorney, Agent, or Firm* — Womble Bond Dickinson (US) LLP; Joseph Bach, Esq.

(57) ABSTRACT

An antenna array having radiating elements and delay lines provided over a sandwich of layers that includes variable dielectric-constant material. The value of the variable dielectric-constant material at various points over the antenna is controlled via software, hence changing the operational characteristics of the antenna using software. The sandwich of layers may be a standard flat panel display, wherein images depicted on the flat panel display are software controlled with a program designed to change the dielectric constant, thus providing scanning and tuning ability to the array. That is, different images are programmed according to specifically desired change in the dielectric property of different pixels under different patches or feedlines of the array, thereby controlling the frequency and/or directivity of the array.

22 Claims, 3 Drawing Sheets

Related U.S. Application Data on Sep. 1, 2016, provisional application No. 62/382,489, filed on Sep. 1, 2016.

(51) Int. Cl.
| | | |
|---|---|---|
| *H04B 7/08* | (2006.01) | |
| *H04L 27/18* | (2006.01) | |
| *H01Q 3/24* | (2006.01) | |
| *H01Q 9/14* | (2006.01) | |
| *H01Q 21/28* | (2006.01) | |
| *H01Q 21/06* | (2006.01) | |

(56) References Cited

U.S. PATENT DOCUMENTS

| | | | |
|---|---|---|---|
| 9,625,409 B1* | 4/2017 | Cai | G01N 27/26 |
| 9,726,631 B1* | 8/2017 | Cai | G01N 27/327 |
| 2003/0205967 A1* | 11/2003 | Natarajan | H01J 29/68 |
| | | | 313/497 |
| 2011/0132641 A1* | 6/2011 | Wong | H01P 3/121 |
| | | | 174/254 |
| 2015/0084814 A1* | 3/2015 | Rojanski | H01Q 1/42 |
| | | | 342/368 |
| 2018/0062272 A1* | 3/2018 | Haziza | H01Q 21/0087 |

* cited by examiner

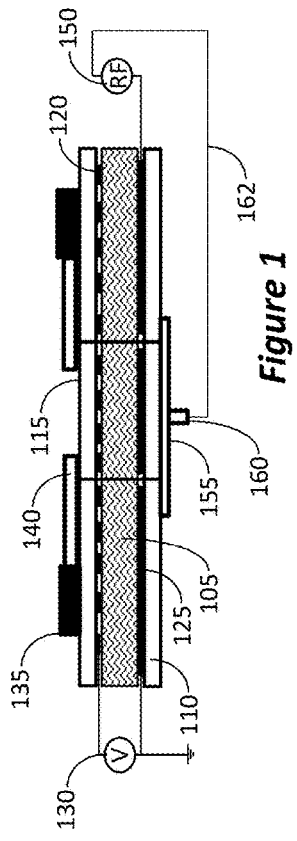
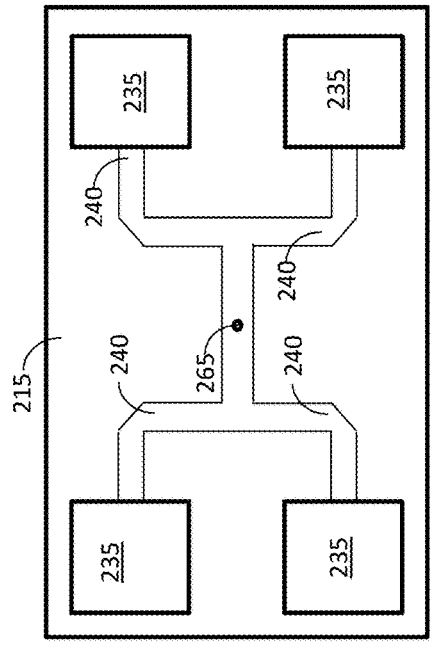
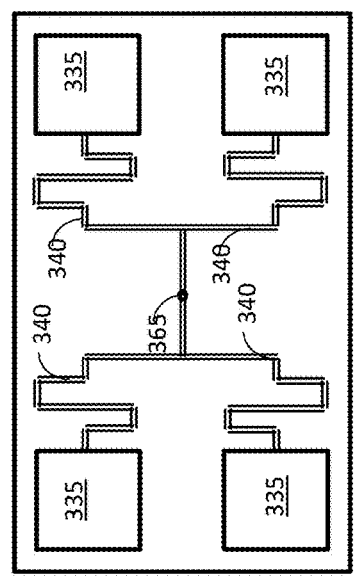
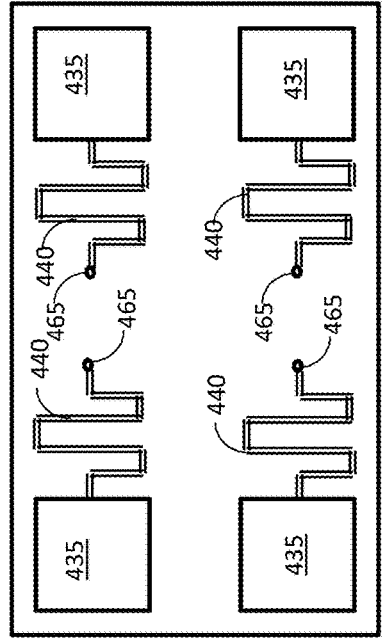
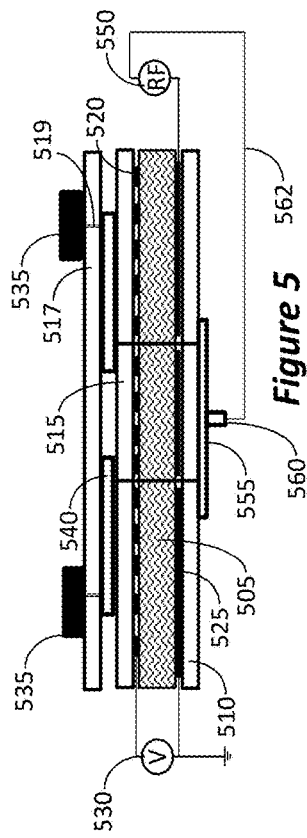

SOFTWARE CONTROLLED ANTENNA

RELATED APPLICATIONS

This Application claims priority benefit from U.S. Provisional Application No. 62/382,489, filed on Sep. 1, 2016, U.S. Provisional Application No. 62/382,506, filed on Sep. 1, 2016, and U.S. Provisional Application No. 62/431,393, filed on Dec. 7, 2016, and is also related to U.S. patent application Ser. No. 15/421,388, filed on Jan. 31, 2017, and U.S. patent application Ser. No. 15/654,643, filed on Jul. 19, 2017, the disclosures of all of which are incorporated herein by reference in their entireties.

BACKGROUND

1. Field

This disclosure relates to design and operation of RF antennas, and especially to antennas having an array of radiating elements forming a directionally controlled radiation beam. The disclosure also relates to a combination of arrays that yield an omni-directional coverage and/or 3D hemispherical coverage.

2. Related Art

Much of today's communication is done wirelessly, or at least part of the path is wireless. All wireless communication requires antennas on both transmit and receive sides. Generally, much of the transmission may be done utilizing an omni-directional antenna. In such antennas, the transmission power drops in reverse relation to the distance cubed. Thus, in order to reach many users the transmission power is usually relatively high as compared to directional antennas. Also, when several omni-directional antennas operate simultaneously, e.g., multiple devices in an Internet café, the various transmissions may interfere with each other, or at least reduce the quality of transmission and reception in that environment.

Another trend is for mobile devices to be fabricated out of block of metal, e.g., aluminum, such that much of the body of the device may block RF radiation. Consequently placement of the antenna is very restricted. Moreover, since mobile devices normally use several wireless communication protocols, they may require several antennas, each designed for the frequency of the specific protocol, e.g., WiFi, Bluetooth, NFC, etc. Since the real estate area on mobile devices is at a high premium, it is very difficult to design and place such antennas within the device.

In a prior disclosure, the subject inventor has disclosed an antenna that utilizes variable dielectric constant to control the characteristics of the antenna. Details about that antenna can be found in U.S. Pat. No. 7,466,269, the entire disclosure of which is incorporated herein by reference. This disclosure builds on the basic elements disclosed in the '269 patent and provides further improvements and features.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed is a software controlled antenna. According to some embodiments, an antenna array is printed or deposited over a sandwich of layers that includes variable dielectric-constant material. The value of the variable dielectric-constant material at various points over the antenna is controlled via software, hence changing the operational characteristics of the antenna using software. The sandwich of layers may be a standard flat panel display, wherein images depicted on the flat panel display are software controlled with a program designed to change the dielectric constant, thus providing scanning and tuning ability to the array. That is, different images are programmed according to specifically desired change in the dielectric property of different pixels under different patches or feed-lines of the array, thereby controlling the frequency and/or directivity of the array, and the direction of the radiation beam of the antenna (i.e., enabling electronic steering of the antenna).

When the antenna is not visible to a user, e.g., when the antenna is inside a WiFi HotSpot, the array can be made using metallic conductor, such as copper, aluminum, etc. Conversely, when the antenna is visible and visibility of the flat panel display is important, e.g., in mobile devices, the array can be made using transparent conductor, such as ITO, AZO etc. Of course, transparent conductor can also be used for non-visible antenna and metallic conductor can be used with visible antennas.

An aspect addressed by disclosed embodiment is the RF feeding to the radiating element. Since the radiating patches and the delay lines are provided over a variable dielectric constant material which can change the value of its dielectric constant during operation, coupling the RF signal to the patch and delay line needs to be done in a way that is "shielded" from the changes in the dielectric constant.

According to disclosed embodiments, an antenna is provided comprising: an LCD screen having a common ground contact, a plurality of addressable pixel contacts, and a top dielectric; an array of radiating elements provided over the top dielectric; conductive delay lines, each connected to one of the radiating elements; and a transmission feed provided below the LCD screen and coupled to the delay lines. A controller is coupled to the common contact and to each of the addressable pixel contacts, the controller being preprogrammed to energize selective ones of the pixel control contacts to change the spatial directivity of the radiating elements.

Disclosed embodiments also provide a multi-layer antenna, comprising: a top dielectric, a bottom dielectric, a variable dielectric constant material sandwiched between the top dielectric and the bottom dielectric, a plurality of conductive electrodes defining pixels within the variable dielectric constant material, a common ground electrode, at least one radiating patch provided over the top dielectric, each radiating patch having a corresponding delay line coupled to the radiating patch, a feed line provided below the bottom dielectric, and an RF coupling between the feed line and the delay line. The coupling may be a conductive line passing through corresponding windows formed in the common ground electrode.

Embodiments of the invention provide a wireless access point, comprising: a transceiver; an antenna array comprising an LCD screen having a common contact, a plurality of pixel control contacts, and a top dielectric; an array of radiating elements provided on top of the top dielectric; and plurality of delay lines, each connected to one of the radiating elements; a plurality of feed lines connected at one end to the transceiver and the opposite end one of the delay lines; and, a controller coupled to the common contact and to each of the pixel control contacts, the controller being preprogrammed to activate energize selective ones of the pixel control contacts to change spatial directivity of the plurality of radiating elements.

A further aspect is a method for operating the antenna, comprising: scanning a radiation cone formed by radiating elements of the antenna; using transmissions received during the scanning, identifying specific locations in space of each originating transmission; from the originating transmissions, identifying locations of unauthorized transmissions; controlling the antenna to present a null to directions of the unauthorized transmissions; and performing directed communication with each authorized transmission by controlling the antenna to steer the radiation cone towards the authorized directions. Scanning the radiation cone can be performed by applying voltages to change the dielectric constant presented under the delay lines of the antenna. Optionally, for each authorized transmission, identifying the transmitting device and determining the device's network and access policies, and applying the network and access policies to the communications from the identified device, thereby forming an "RF firewall."

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a cross-section of a software controlled antenna according to one embodiment.

FIG. 2 illustrates a top elevation view of a software controlled antenna according to one embodiment.

FIG. 3 illustrates a top elevation view of a software controlled antenna according to another embodiment.

FIG. 4 illustrates a top elevation view of a software controlled antenna according to another embodiment.

FIG. 5 illustrates a cross-section of a software controlled antenna according to yet another embodiment.

DETAILED DESCRIPTION

Figure 6:
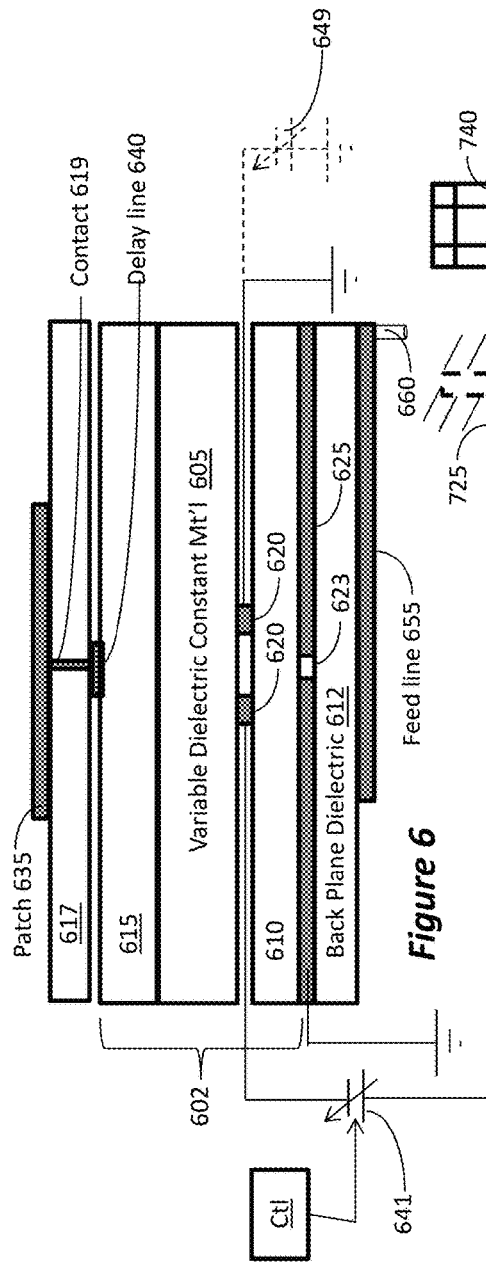
FIG. 6 illustrates a cross-section of one radiating element of a software controlled antenna according to yet another embodiment.

Embodiments of the inventive antenna will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

FIG. 1 illustrates a cross-section of a software controlled antenna according to one embodiment. In FIG. 1 multi-layer antenna having variable dielectric-constant material is constructed by having variable dielectric constant (VDC) material, e.g., liquid crystals 105 sandwiched between a top dielectric 115 and a bottom dielectric 110. The liquid crystals are controlled by applied voltage from voltage potential source 130 to desired contacts 120, which define pixels of the multi-layer antenna. In that sense, the contacts 120 form addressable contacts enabling individual addressing of each contact by a processor. The ground potential of voltage potential source is coupled to the bottom common ground electrode 125. The antenna comprises an array of radiating elements, e.g., patches 135 that are interconnected via delay lines 140. The patches 135 and the delay lines 140 are provided on the top dielectric 115.

In one example either or both dielectrics 110 and 115 is made of a Rogers® (FR-4 printed circuit board) or PTFE based materials, and the delay lines 140, radiating patches 135, and/or common ground electrode 125, may be a conductor formed on the Rogers. Rather than using Rogers, a PTFE (Polytetrafluoroethylene or Teflon®), PET (Polyethylene terephthalate), or other low loss material may be used.

It has been discovered by the inventor that improved results can be achieved if the RF feed can be provided from below the multi-layers antenna. In fact, it was discovered that superior results can be achieved if the RF feed is coupled from below the common ground bottom electrode 125. As noted by the inventor, providing the feed line below the common ground helps isolate the RF feed from the delay lines and the DC or AC voltage applied to the VDC layer. FIG. 1 illustrates an embodiment of a feed that is provided from below the layers, and below the common ground electrode 125. As shown in FIG. 1, the ground side of the RF Tx/Rx (transceiver) 150 is coupled to the common ground electrode 125. However, the signal side is connected to feed electrode 155, which is provided on the bottom of dielectric 110. The coupling may be by, e.g., a coaxial cable 162 connected to coaxial connector 160. In this embodiment, vias are formed in the entire sandwich structure, including holes or windows in the common ground electrode 125, top and bottom dielectrics 115 and 110, and VDC layer 105, so that the feed electrode 155 can be connected to the delay line 140. By using this arrangement, the signal of source 130 is insulated or decoupled from the RF signal of Tx/Rx 150, and the changes in dielectric constant of material 105 do not affect the signal traveling in the feed electrode 155, but rather only the signal traveling in delay line 140 and radiating patch 135.

Using software, the value of the variable dielectric-constant material in the areas just below the patches 135 can be changed by applying voltage to the relevant pixels, to thereby control the frequency matching of the patches. Similarly, the voltage applied to the pixels under the delay lines 140 can be controlled to change the spatial directivity of the array, or the rotational polarity of the signal. Either action acts only on the signal traveling though the relevant part, i.e., radiating patch 135 or delay line 140, but not on the signal traveling on feed electrode 155.

Thus, according to this embodiment, a multi-layer antenna is provided, comprising: a top dielectric, a bottom dielectric, a variable dielectric constant material sandwiched between the top dielectric and the bottom dielectric, a plurality of conductive electrodes defining pixels within the variable dielectric constant material, a common ground electrode, at least one radiating patch provided over the top dielectric, each radiating patch having a corresponding delay line coupled to the radiating patch, a feed line provided below the bottom dielectric, and an RF coupling between the feed line and the delay line. The coupling may be a conductive line passing through corresponding windows formed in the common ground electrode 125.

This can be seen more clearly in FIG. 2, which is a top view of an array of 2×2 radiating elements 235 with delay lines 240 provided on the top dielectric 215. The cross section of the embodiment of FIG. 2 is similar to that of FIG. 1, except that a single via is provided in the location marked by circle 265, and a contact is made to the feed electrode that is provided below the dielectric 210, which are not visible in this view. In this embodiment the single contact via is chosen to be at the symmetric geometrical center of the array and feed line. In the particular example of FIG. 2, the via location provides 180° rotational symmetry; however, other rotational symmetries can be used, e.g., 30°, 90°, etc.

When the via is provided at the geometrical center, the signal propagates evenly through all of the array elements. The operational characteristics of the antenna can then be controlled by applying voltage to various pixels to change the orientation of the liquid crystals at the pixels location. For example, when the same voltage is applied to the pixels residing directly under all of the patches 235, the resonant frequency of the patches 235 can be changed, thereby changing the operational frequency of the antenna. On the other hand, by applying different potentials under the delay lines, the resulting radiation cone can be steered, thereby directing the antenna to a particular location in space or scanning the antenna, without physically moving the antenna. That is, the change in dielectric constant under the delay lines causes a delay in the propagation of signal in that delay line, thus causing a phase shift in the radiating signal.

Another feature is presented in FIG. 3, wherein the delay lines are formed as meandering conductive lines in order to enable wider range of control over the delay line, especially in tight real estate when the patches are closely packed together. The antenna of FIG. 3 is somewhat similar to that of FIG. 2, except that each delay line 340 is formed as a meandering line, such that its length covers more pixels. Consequently, more pixels are available to control the dielectric constant over the length of the delay line.

In the previous embodiments, all of the delay lines were connected together and fed from a single feeding point. However, this is not a requirement. For example, in the embodiment of FIG. 4 each of the meandering delay lines has a corresponding feed point 465, which is coupled to a feed line through a corresponding coupling. In such an arrangement the accumulation of the signals from the radiating patches is done below the sandwich structure of the antenna by, e.g., having interconnection of all of the feeding lines. Thus, in this embodiment a multi-layer antenna is provided, comprising: a top dielectric, a bottom dielectric, a variable dielectric constant material sandwiched between the top dielectric and the bottom dielectric, a plurality of conductive electrodes defining pixels within the variable dielectric constant material, a common ground electrode, at least one radiating element provided over the top dielectric, each radiating element having: a corresponding delay line coupled to the radiating patch, a corresponding feed line provided below the bottom dielectric, and corresponding a RF coupling between the feed line and the delay line.

FIG. 5 is a cross-section of an antenna according to yet another embodiment. The embodiment of FIG. 5 is similar to that of FIG. 1, except that the radiating patches 535 and the delay lines 540 are provided on different levels of the multi-layer structure of the antenna. Specifically, a cover insulating layer 517 is provided over the top dielectric 515. The cover insulating layer 517 may be Glass, PET, Rogers, PTFE, etc. The delay lines 540 are provided between the top dielectric 515 and the cover insulating layer 517. The radiating patches 535 are provided over the cover insulating layer 517. Holes are provided in the cover insulating layer 517, so that contacts 519 can electrically connect the delay lines 540 to their respective radiating patches 535.

Figure 7:
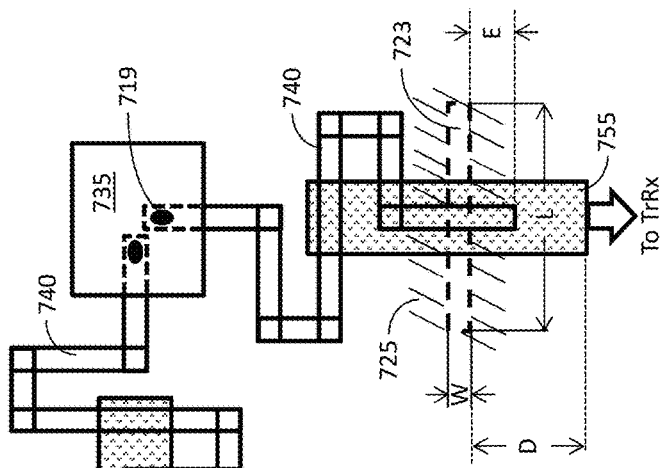
FIG. 7, illustrates a top "transparent" view of the embodiment of FIG. 6.

FIG. 6 illustrates a cross section at a location of one radiating element according to another embodiment of the multi-layer antenna. This structure can repeat for as many radiating elements as needed to form an array. The structure and operation of the embodiment can be better understood from the following description of FIG. 6, with further reference to FIG. 7, which is a top "transparent" view. FIG. 6 illustrates a cross section of relevant sections of the antenna at the location of the radiating element 635. FIG. 7 provides a top "transparent" view that is applicable to all of the embodiments described herein, including the embodiment of FIG. 6. Thus, in studying any of the embodiments disclosed herein, the reader should also refer to FIG. 7 for a better understanding.

A cover insulating layer 617 is generally in the form of a dielectric (insulating) plate or a dielectric sheet, and may be made of, e.g., glass, PET, PTFE, Rogers, etc. The radiating patch 635 is formed over the cover insulating layer 617 by, e.g., adhering a conductive film, sputtering, printing, etc. At each patch location, a via is formed in the cover insulating layer 617 and is filled with conductive material, e.g., copper, to form contact 619, which connects physically and electrically to radiating patch 635. A delay line 640 is formed on the bottom surface of cover insulating layer 617 (or on top surface of top dielectric 615, which functions as an upper binder), and is connected physically and electrically to contact 619. That is, there is a continuous DC electrical connection from the delay line 640 to radiating patch 635, through contact 619. As shown in above embodiments, the delay line 640 may be a meandering conductive line and may take on any shape so as to have sufficient length to generate the desired delay, thereby causing the desired phase shift in the RF signal.

The delay in the delay line 640 is controlled by the variable dielectric constant (VDC) plate 602 having variable dielectric constant material 605. While any manner for constructing the VDC plate 602 may be suitable for use with the embodiments of the antenna, as a shorthand in the specific embodiments the VDC plate 602 is shown consisting of upper binder 615, (e.g., glass PET, etc.) variable dielectric constant material 605 (e.g., twisted nematic liquid crystal layer), and bottom binder 610. In other embodiments one or both of the binder layers 615 and 610 may be omitted. Alternatively, adhesive such as epoxy or glass bead spacers may be used instead of the binder layers 615 and/or 610.

In some embodiments, e.g., when using twisted nematic liquid crystal layer, the VDC plate 602 also includes an alignment layer that may be deposited and/or glued onto the bottom of cover insulating layer 617, or be formed on the upper binder 615. The alignment layer may be a thin layer of material, such as polyimide-based PVA, that is being rubbed or cured with UV in order to align the molecules of the LC at the edges of confining substrates.

The effective dielectric constant of VDC plate 602 can be controlled by applying DC potential across the VDC plate 602. For that purpose, electrodes are formed and are connected to controllable voltage potential. There are various arrangements to form the electrodes, and one example is shown in the arrangement of FIG. 6, wherein two electrodes 620 and provided—one next to the other—wherein the two electrodes define a pixel. As one example, one of the electrodes 620 is shown connected to variable voltage potential 641, while the other electrode 620 is connected to ground. As one alternative, shown in broken line, the other electrode 620 may also be connected to a variable potential 649. Thus, by changing the output voltage of variable potential 641 and/or variable potential 649, one can change the dielectric constant of the VDC material in the vicinity of the electrodes 620, and thereby change the RF signal traveling over delay line 640. Changing the output voltage of variable potential 641 and/or variable potential 649 can be done using a controller, Ctl, running a software that causes the controller to output the appropriate control signal to set the appropriate output voltage of variable potential 641 and/or variable potential 649. Thus, the antenna's performance and characteristics can be controlled using software—hence software controlled antenna.

At this point it should be clarified that in the subject description the use of the term ground refers to both the generally acceptable ground potential, i.e., earth potential, and also to a common or reference potential, which may be a set potential or a floating potential. Similarly, while in the drawings the symbol for ground is used, it is used as shorthand to signify either an earth or a common potential, interchangeably. Thus, whenever the term ground is used herein, the term common or reference potential, which may be set or floating potential, is included therein.

As with all RF antennas, reception and transmission are symmetrical, such that a description of one equally applies to the other. In this description it may be easier to explain transmission, but reception would be the same, just in the opposite direction.

In transmission mode the RF signal is applied to the feed line 655 via connector 660 (e.g., a coaxial cable connector). As shown in FIG. 6, in this embodiment there is no electrical DC connection between the feed line 655 and the delay line 640. However, in this disclosed embodiment the layers are designed such that an RF short is provided between the feed line 655 and delay line 640. As illustrated in FIG. 6, a common ground electrode 625 is formed on the top surface of back plane insulator (or dielectric) 612 or the bottom surface of bottom binder 610. The common ground electrode 625 is generally a layer of conductor covering the entire area of the antenna array. At each RF feed location a window (DC break) 623 is provided in the common ground electrode 625. The RF signal travels from the feed line 655, via the window 623, and is capacitively coupled to the delay line 640. The reverse happens during reception. Thus, a DC open and an RF short are formed between delay line 640 and feed line 655.

In one example, the back plane insulator 612 is made of a Rogers® (FR-4 printed circuit board) and the feed line 655 may be a conductive line formed on the Rogers. Rather than using Rogers, a PTFE (Polytetrafluoroethylene or Teflon®) or other low loss material may be used.

To further understand the RF short (also referred to as virtual choke) design of the disclosed embodiments, reference is made to FIG. 7. One should note that similar elements in the drawings have the same references, except in a different series, e.g., in FIG. 7 the 7xx series is used. Also, FIG. 7 illustrates an embodiment with two delay lines 740 connected to a single radiating patch 735, such that each delay line may carry a different signal, e.g., at different polarization. The following explanation is made with respect to one of the delay lines, as the other may have similar construction.

In FIG. 7 the radiating patch 735 is electrically DC connected to the delay line 740 by contact 719. So, in this embodiment the RF signal is transmitted from the delay line 740 to the radiating patch 735 directly via the contact 719. However, no DC connection is made between the feed line 755 and the delay line 740; rather, the RF signal is capacitively coupled between the feed line 755 and the delay line 740. This is done through an aperture in the common ground electrode 725. As shown in FIG. 6, the VDC plate 602 is positioned below the delay line 640, but in FIG. 7 it is not shown, so as to simplify the drawing for better understanding of the RF short feature. The common ground electrode 725 is partially represented by the hatch marks, also showing the window (DC break) 723. Thus, in the example of FIG. 7 the RF path is radiating patch 735, to contact 719, to delay line 740, capacitively through window 723 to feed line 755.

For efficient coupling of the RF signal, the length of the window 723, indicated as "L", should be set to about half the wavelength of the RF signal traveling in the feed line 755, i.e., $\lambda/2$. The width of the window, indicated as "W", should be set to about a tenth of the wavelength, i.e., $\lambda/10$. Additionally, for efficient coupling of the RF signal, the feed line 755 extends about a quarter wave, $\lambda/4$, beyond the edge of the window 723, as indicated by D. Similarly, the terminus end (the end opposite contact 719) of delay line 740 extends a quarter wave, $\lambda/4$, beyond the edge of the window 723, as indicated by E. Note that distance D is shown longer than distance E, since the RF signal traveling in feed line 755 has a longer wavelength than the signal traveling in delay line 740.

It should be noted that in the disclosure, every reference to wavelength, $\lambda$, indicates the wavelength traveling in the related medium, as the wavelength may change as it travels in the various media of the antenna according to its design and the DC potential applied to variable dielectric matter within the antenna.

Figure 8:
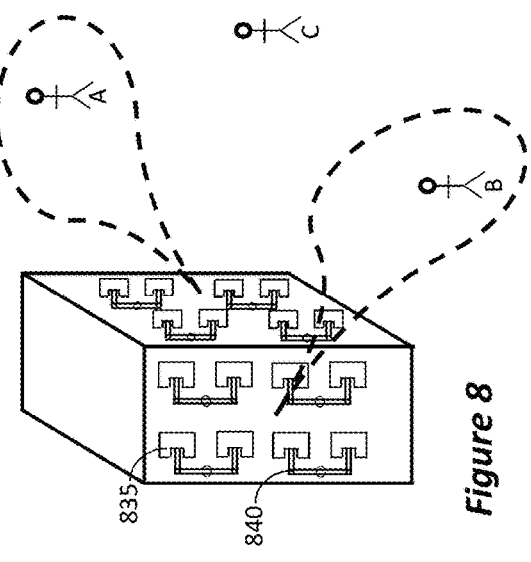
FIG. 8 illustrates an omni-directional steerable antenna according to one embodiment.

FIG. 8 illustrates an omni-directional steerable antenna that can be constructed using any of the disclosed embodiments. The antenna comprises four sides, or facets, wherein each side includes a 2×4 array of radiating elements 835, interconnected via delay lines 840. The structure of each of the facets, including the radiating elements 835, the delay lines, 840, and the feed lines may be done using any of the embodiments disclosed herein. By controlling the dielectric constant under each of the delay line, the radiation cone of each facet can be steered in space; thus, by controlling all four facets the antenna can selectively transmit and receive selectively in any direction around the antenna. For example, the antenna can be steered to perform directional communication with users A and B, but present a null towards unauthorized user C, thus preventing user C from intruding into the system.

In constructing the antenna according to the disclosed embodiments, the variable dielectric constant sandwich may be implemented by simply using an LCD. Of course, in applications where the LCD is not visible, e.g., WiFi access point, base station, etc., the LCD may be black and white only (i.e., the color filters layer may be omitted). Also, the illumination and polarization elements of a standard LCD may be dispensed with, since they do not contribute to frequency matching or spatial scanning of the antenna array. Also, if the antenna is not visible, the patches and feed lines may be made of solid metal, such as copper and aluminum. When the antenna is visible, the patches and feed lines may be made of transparent conductor, such as an ITO, AZO, etc.

In this sense, one embodiment of the invention may be characterized as providing an antenna comprising: an LCD screen having a common ground contact, a plurality of addressable pixel contacts, and a top dielectric; an array of radiating elements provided over the top dielectric; conductive delay lines, each connected to one of the radiating elements; and a transmission feed provided below the LCD screen and coupled to the delay lines. A controller is coupled to the common contact and to each of the addressable pixel contacts, the controller being preprogrammed to energize selective ones of the pixel control contacts to change the spatial directivity of the radiating elements.

Using software control to scan the flat antenna array, one can achieve scanning in two-dimensions in space. Thus, for example, such an array can be used as a flat satellite TV antenna. The antenna can be placed on the roof, such that it is not visible from street level. Since the spatial directivity of the array can be controlled electrically using software, the antenna need not be mechanically aimed at the satellite, as do conventional dish antennas. Rather, the satellite can be acquired by scanning the antenna electrically by changing the voltages applied to the electrode of the variable dielectric layer (i.e., changing the images projected on the LCD screen when an LCD is used), until the best reception is achieved.

Due to the proliferation of mobile devices, conventional access points, such as WiFi access points, are loaded with interfering transmissions. Specifically, since standard access points use omni-directional antennas, the access point transmits and receives in all directions. Therefore, in transmission the access point must use high energy, since the transmitted energy drops inversely to the distance cubed for an omni-directional antenna. Moreover, the access point's transmission adds to the interference of the multiple mobile devices (smartphones, pads, laptops), each of which uses omni-directional antenna that interferes with everyone else's device.

Using the embodiment illustrated in FIG. 8, an access point can be fabricated that receives and transmits to a specific direction. That is, prior to the transmission to a particular device, the voltage of the electrodes of the VDC plate can be changed such that the antenna is aimed at the target device. Since the transmission is at high frequency, and since the antenna can be scanned electronically, the antenna can be re-directed each time it transmits to a different mobile device positioned at different spatial location with respect to the access point.

Moreover, as shown in FIG. 8, multiple arrays may be used, each controlled individually, since each pixel on the VDC plate can be controlled individually. Furthermore, while in FIG. 8, the four individual arrays are placed on four individual facets, other arrangements can be made, e.g., three facets of a triangle, five facets of a pentagon, etc. In this manner, each array is directed to a dedicated spatial area and the arrays together cover 360 around the access point.

Also, the software defined antenna system described herein can provide a significant advantage when applying policies, security schemes and access to wireless communication, such as WiFi access point. For example, since the antenna can be scanned to cover 360°, it provides the ability to dynamically create a 3D map of the environment of users, interference signals and intruders. By properly operating the phased array scanning capability of the array, the system can identify and isolate an unauthorized user, e.g., an intruder, in space, inspect its characteristics, and decide to eliminate its ability to connect to the network by creating a null in space that can then track and prevent that intruder from ever reaching the network. In a sense this creates a wireless fire-wall at the wave-port level. Additionally, optionally the system can identify each approved user (e.g., using MAC address) per location in space around the antenna, and determine what network and access policies privileges apply to the particular user. For example, different network and access policies will apply to an employee than to a visitor at a company. The system can then apply network and access policies based on location in space of the Tx/Rx. Since the software defined antenna is able scan and to track users by forming directional beams and nulls, the network and access policies can be maintained for each identified user.

Figure 9:
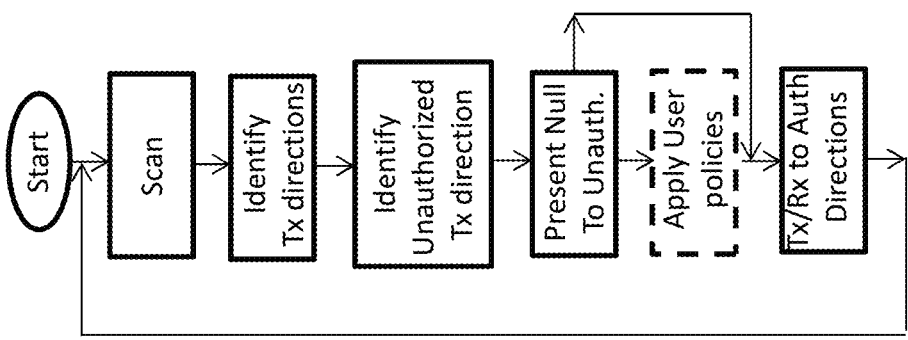
FIG. 9 illustrates a method according to an embodiment utilizing any of the software defined antennas described herein.

FIG. 9 illustrates a method for operating the antenna according to an embodiment utilizing any of the software defined antennas described herein. After start, the system scans the antenna by, e.g., applying voltages to change the dielectric constant presented under the delay lines of the antenna. Using transmissions received during the scan, the system identifies specific location in space of each originating transmission. From the set of identified transmissions, the system then identifies locations of unauthorized transmissions. The system then controls the antenna to present a null to the unauthorized directions. The system then performs directed communication with each authorized transmission by controlling the antenna to form a beam directed at the authorized direction. Optionally, as shown in broken-line, for each user the system identifies the transmitting device and determines the device's network and access policies. The system then applies the network and access policies to the communication from the identified device.

Figure 10:
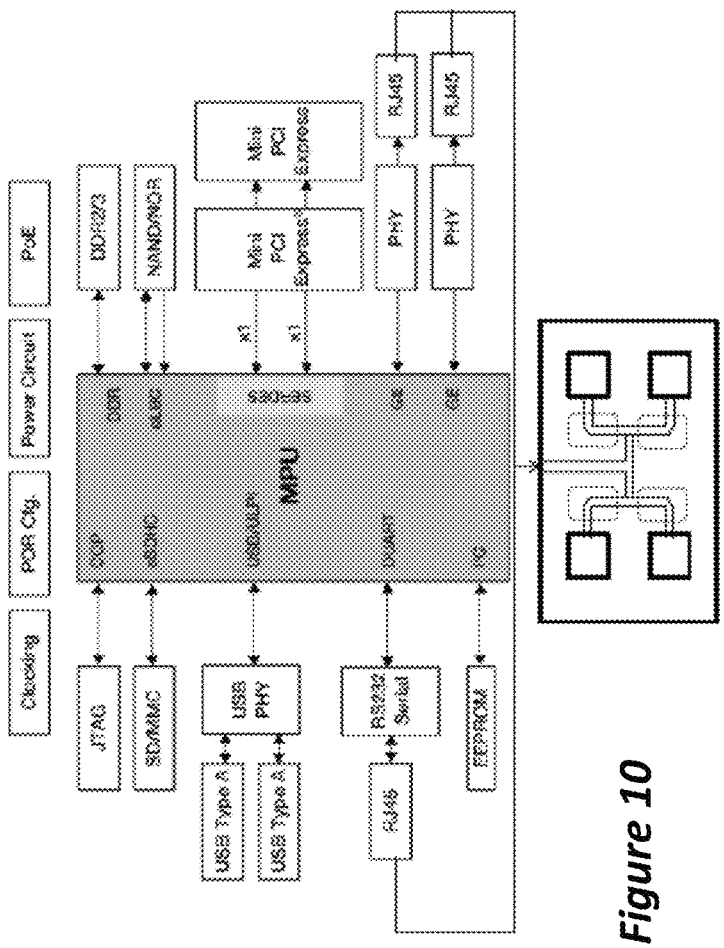
FIG. 10 is a block diagram illustrating how the antenna of any of the disclosed embodiments can be incorporated in a standard IEEE 802.11N access point.

FIG. 10 is a block diagram illustrating how the antenna of any of the disclosed embodiments can be incorporated in a standard IEEE 802.11N access point. The structure and elements of the standard access point are well known in the art and need not be explained here. In the example of FIG. 10, the standard antenna is replaced by a software defined antenna. Also, the microprocessor (MPU) is programmed to provide the required voltages to steer the antenna or to change the resonance frequency of the radiating patches.

In this sense, embodiments of the invention may be characterized as providing a wireless access point, comprising: a transceiver; an antenna array comprising an LCD screen having a common contact, a plurality of pixel control contacts, and a top dielectric; an array of radiating elements provided on top of the top dielectric; and plurality of delay lines, each connected to one of the radiating elements; a plurality of feed lines connected at one end to the transceiver and the opposite end one of the delay lines; and, a controller coupled to the common contact and to each of the pixel control contacts, the controller being preprogrammed to activate energize selective ones of the pixel control contacts to change spatial directivity of the plurality of radiating elements.

Various embodiments were described above, wherein each embodiment is described with respect to certain features and elements. However, it should be understood that features and elements from one embodiment may be used in conjunction with other features and elements of other embodiments, and the description is intended to cover such possibilities, albeit not all permutations are described explicitly so as to avoid clutter.

Also, the terminology used herein with respect to connected and coupled follows the convention that connected means one part is directly connected to the other, while coupled means that there may be intervening elements between the two parts. Also, it should be understood that a DC connection is akin to a DC short, wherein one conductor physically touches the other conductor to enable DC current flow. However, an RF coupling does not necessarily require the two conductors to physically touch. A valid example is two capacitor plates, wherein DC current cannot be transmitted through them, but AC and RF can be transmitted.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. An antenna comprising:
a variable dielectric constant (VDC) layer comprising a top dielectric layer, a bottom dielectric layer and variable dielectric constant material sandwiched between the top dielectric layer and the bottom dielectric layer;
a common ground electrode provided below the VDC layer;
a plurality of addressable contacts provided over the VDC plate, wherein each addressable contact defines a pixel and is configured to apply electric field over the VDC material at the location of the pixel;
at least one radiating element provided over the VDC layer;
at least one delay line provided over the VDC layer, each of the at least one radiating element being RF coupled to at least one of the delay line; and
at least one conductive feed line provided below the VDC plate and coupled to the at least one delay line.

2. The antenna of claim 1, wherein the at least one conductive feed line is coupled to the at least one delay line through a window formed in the common ground electrode.

3. The antenna of claim 1, wherein the at least one conductive feed line is coupled to the at least one delay line by a contact passing through a window formed in the common ground electrode.

4. The antenna of claim 1, further comprising a cover insulating layer provided over the VDC layer, and wherein the at least one radiating element is provided over the cover insulating layer.

5. The antenna of claim 4, wherein the at least one delay line is provided below the cover insulating layer.

6. The antenna of claim 5, further comprising a via formed in the cover insulating layer to couple the at least one delay line to the corresponding at least one radiating element.

7. The antenna of claim 1, wherein each of the at least one delay lines is formed as a meandering line.

8. The antenna of claim 1, wherein the at least one delay line comprises a plurality of delay lines, and wherein subgroups of the plurality of delay lines are interconnected by a conducting line.

9. The antenna of claim 8, wherein the at least one conductive feed line is coupled to the conducting line.

10. The antenna of claim 9, wherein the at least one conductive feed line is coupled to the conducting line at the geometrical center of the conducting line.

11. The antenna of claim 1, wherein the VDC material comprises liquid crystals material.

12. The antenna of claim 1, wherein at least one of the top dielectric layer and the bottom dielectric layer comprises Rogers, PTFE (Polytetrafluoroethylene), or PET (Polyethylene terephthalate).

13. The antenna of claim 4, wherein the cover insulating layer comprises glass, Rogers, PTFE (Polytetrafluoroethylene), or PET (Polyethylene terephthalate).

14. An antenna comprising:
a variable dielectric constant (VDC) layer comprising a top dielectric layer, a bottom dielectric layer and variable dielectric constant material sandwiched between the top dielectric layer and the bottom dielectric layer;
a common ground electrode provided below the VDC layer;
a plurality of addressable contacts provided over the VDC plate, wherein each addressable contact defines a pixel and is configured to apply electric field over the VDC material at the location of the pixel;
a plurality of radiating elements provided over the VDC layer;
a plurality of delay lines provided over the VDC layer, each of the radiating elements being RF coupled to at least one of the delay lines; and
a plurality of conductive feed lines provided below the VDC plate, wherein each of the plurality of feed lines being RF-coupled to one of the plurality of delay lines.

15. The antenna of claim 14, wherein each of the plurality of radiating elements is coupled to two of the plurality of delay lines.

16. The antenna of claim 14, wherein the common ground electrode comprises a plurality of windows and wherein each of the plurality of conductive feed lines is coupled to a corresponding delay line through one of the plurality of windows.

17. The antenna of claim 16, wherein each window has a length of half a wavelength of RF signal traveling in the feed line and width of one tenth the wavelength of the RF signal traveling in the feed line.

18. The antenna of claim 17, wherein a terminus end of the feed line extends beyond the window a distance D of about a quarter of wavelength of RF signal traveling in the feed line.

19. The antenna of claim 18, wherein a terminus end of the delay line extends beyond the window a distance E of about a quarter of wavelength of RF signal traveling in the delay line.

20. The antenna of claim 14, further comprising a plurality of virtual chokes and wherein each of the plurality of conductive feed lines is coupled to a corresponding delay line through one of the plurality of virtual chokes.

21. The antenna of claim 14, wherein each of the plurality of conductive feed lines is coupled to a corresponding delay line through an RF short.

22. The antenna of claim 14, wherein each of the plurality of delay lines comprises a meandering conductive line having one end coupled to one of the plurality of radiating elements and an opposite end coupled to one of the plurality of feed lines.

\* \* \* \* \*